United States Patent [19]

Cohn

[11] 4,099,228
[45] Jul. 4, 1978

[54] HARMONIC MIXING WITH AN ANTI-PARALLEL DIODE PAIR

[75] Inventor: Marvin Cohn, Baltimore, Md.

[73] Assignee: Westinghouse Electric Corp., Pittsburgh, Pa.

[21] Appl. No.: 718,991

[22] Filed: Aug. 30, 1976

Related U.S. Application Data

[63] Continuation of Ser. No. 552,020, Feb. 24, 1975, abandoned.

[51] Int. Cl.² .......................................... H02M 5/20
[52] U.S. Cl. .................................... 363/159; 330/4.9; 331/42; 363/158
[58] Field of Search .................. 321/69 W, 69 NL; 330/4.6, 4.9; 331/37, 42; 307/88.3; 325/445, 446, 449; 363/158, 159

[56] References Cited

U.S. PATENT DOCUMENTS

| 3,169,224 | 2/1965 | Butson | 325/449 |
|---|---|---|---|
| 3,227,955 | 1/1966 | Yasuda et al. | 321/69 NL |
| 3,234,477 | 2/1966 | Pearson | 330/4.9 |
| 3,281,647 | 10/1966 | Hines et al. | 321/69 NL |
| 3,320,542 | 5/1967 | Hsu et al. | 330/4.6 |
| 3,346,740 | 10/1967 | Brubst et al. | 307/88.3 |
| 3,564,447 | 2/1971 | Chase | 331/42 |
| 3,619,760 | 11/1971 | Singh et al. | 321/69 NL |
| 3,638,126 | 1/1972 | Spacek | 325/446 |
| 3,932,815 | 1/1976 | Yuan et al. | 325/445 |

OTHER PUBLICATIONS

*B.S.T.J.* Brief vol. 53, No. 6, Jul.–Aug. 1974, pp. 1179–1183, "Stripline Down Converter With Subharmonic Pump" by Schneider and Snell, Jr.
"Harmonically Pumped Stripline Down–Converter" by Schneider et al.; IEEE Trans. on Microwave Theory. vol. MTT-23, No. 3 pp. 271–275, Mar. 1975.
*AEU* vol. 25, pp. 52–53, Jan. 1971 "A Sub-Harmonic Swept Shottky Barrier Diode Mixer In Microstrip".

*Primary Examiner*—Gerald Goldberg
*Attorney, Agent, or Firm*—R. M. Trepp

[57] ABSTRACT

A harmonic mixer utilizing an anti-parallel configuration of two diodes which, when excited by a voltage waveform $V_{LO}\sin\omega_{LO}t + V_s\sin\omega_s t$ where $V_{LO}$ is much greater than $V_s$, yields a terminal current having angular frequency components $m\omega_{LO} \pm n\omega_s$ with the restriction that $m + n$ is an odd integer. The diode configuration results in low conversion loss mixing when the local oscillator frequency is a subharmonic of the usually required local oscillator frequency, suppression of local oscillator noise sideband effects without the use of filters or hybrid junctions, and suppression of direct video detection.

7 Claims, 8 Drawing Figures

HARMONIC MIXING WITH AN ANTI-PARALLEL DIODE PAIR

This is a continuation of application Ser. No. 552,020 filed Feb. 24, 1975, now abandoned.

BACKGROUND OF THE INVENTION

As is known, harmonic mixing has been used in the past primarily at the higher millimeter wave frequencies where reliable, stable local oscillator sources are either unavailable or prohibitively expensive. However, the conversion loss obtained by harmonic mixing has been typically 3 to 5 db greater than that which can be obtained by fundamental mixing at the same signal frequency. Analysis shows that such a large degradation should not exist, but it assumes that fundamental mixing between the signal and local oscillator is suppressed. Fundamental mixing will, however, take place unless the harmonic mixer provides a reactive termination for these mixer products. In general, that is difficult to accomplish (e.g., In the case of second harmonic mixing, the fundamental mixing difference frequency ($f_s - f_{LO}$) is close to the local oscillator frequency).

SUMMARY OF THE INVENTION

In accordance with the present invention, a new and improved harmonic mixing means is provided characterized in the use of an anti-parallel diode pair rather than a single diode as in conventional diode mixers. The mixer of the invention results in reduced conversion loss by suppressing the fundamental mixing products, has a lower noise figure through suppression of local oscillator noise sidebands, incorporates suppression of direct video detection, and has an inherent self-protection against large peak inverse voltage burnout. These advantageous features are obtained without the use of either filters or balanced circuits employing hybrid junctions.

The above and other objects and features of the invention will become apparent from the following detailed description taken in connection with the accompanying drawings which form a part of this specification, and in which:

FIG. 4b is a plot of power versus frequency for the embodiment of FIG. 4a;

Figure 1A:
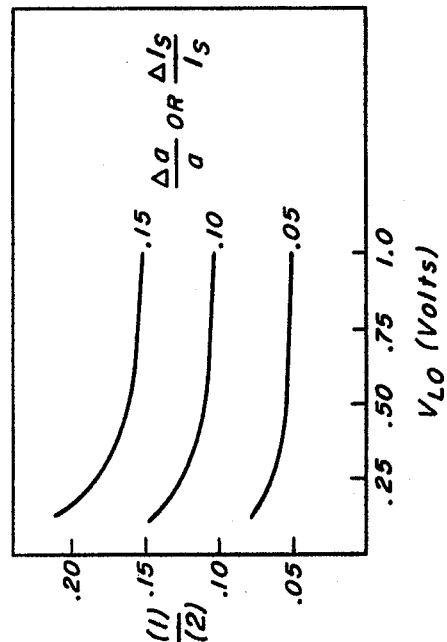
FIGS. 1a and 1b are illustrations, respectively, of a conventional prior art diode mixer and the anti-parallel diode mixer of the invention.

In a conventional single diode mixer as shown in FIG. 1a, application of a voltage waveform $$V = V_{LO} \sin \omega_{LO} t + V_s \sin \omega_s t$$

to the usual asymmetric diode characteristic results in the diode current having all frequencies $mf_{LO} \pm nf_s$. It will be shown in this section that the total current of the anti-parallel diode pair shown in FIG. 1b contains only frequencies for which $m + n$ is an odd integer. The terms in which $m + n$ are even, i.e., even harmonics, fundamental mixing products ($\omega_s - \omega_{LO}$ and $\omega_s + \omega_{LO}$), and the dc term flow only within the diode loop.

Figure 1B:
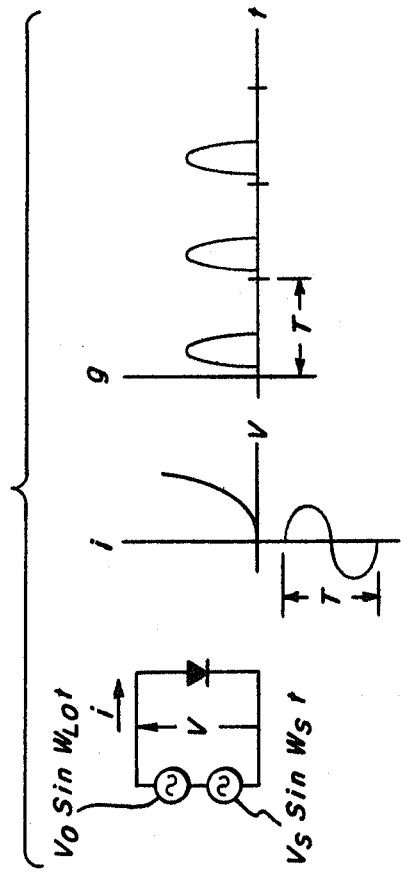

The basic anti-parallel diode pair circuit is shown in FIG. 1b. The instantaneous currents through the diodes, $i_1$ and $i_2$ may be written in the usual fashion:

$$i_1 = -i_s(e^{-\alpha V} - 1) \quad (1)$$

$$i_2 = i_s(e^{\alpha V} - 1) \quad (2)$$

where $\alpha$ is the diode slope parameter ($\alpha \approx 38$ volt$^{-1}$ for typical high quality Gallium Arsenide Schottky barrier diodes). Similarly, the differential conductance for each diode may be written as:

$$g_1 = di_1/dV = \alpha i_s e^{-\alpha V} \quad (3)$$

and $$g_2 = di_2/dV = \alpha i_s e^{\alpha V} \quad (4)$$

The composite time varying conductance, $g$, is simply the sum of the individual conductances.

$$g = g_1 + g_2 = \alpha i_s (e^{\alpha V} + e^{-\alpha V}) = 2 \alpha i_s \cosh \alpha V \quad (5)$$

Examination of this expression reveals that $g$ has even symmetry with V and, as illustrated in FIGS. 1a and 1b, double the number of conductance pulses per local oscillator cycle as compared to a single diode mixer.

For the usual case in which only the local oscillator modulates the conductance of the diodes we may substitute:

$$V = V_{LO} \cos \omega_{LO} t$$

into Equation (5) with the following result $$g = 2 \alpha i_s \cosh (\alpha V_{LO} \cos \omega_{LO} t) \quad (6)$$

which may be expanded in the following series:

$$g = 2 \alpha i_s [I_0(\alpha V_{LO}) + 2 I_2(\alpha V_{LO}) \cos 2 \omega_{LO} t + 2 I_4(\alpha V_{LO}) \cos 4 \omega_{LO} t + \ldots] \quad (7)$$

where $I_n(\alpha V_{LO})$ are modified Bessel functions of the second kind. Notice that the conductance components consist of a dc term plus even harmonics of the local oscillator frequency, $\omega_{LO}$. For the applied voltage, $V = V_{LO} \cos \omega_{LO} t + V_s \cos \omega_s t$, the current expression is:

$$i = g (V_{LO} \cos \omega_{LO} t + V_s \cos \omega_s t \quad (8)$$

$$i = A \cos \omega_{LO} t + B \cos \omega_s t + C \cos 3 \omega_{LO} t + D \cos 5 \omega_{LO} t + E \cos (2 \omega_{LO} + \omega_s) t + F \cos (2 \omega_{LO} - \omega_s) t + G \cos (4 \omega_{LO} + \omega_s) t + H \cos (4 \omega_{LO} - \omega_s) t + \ldots \quad (9)$$

It can be seen that the total current only contains frequency terms, $mf_{LO} \pm nf_s$, where $m + n$ is an odd integer; i.e., $m + n = 1, 3, 5, \ldots$ In FIG. 1b a circulating current, $i_c$, is also indicated. This current arises from the fact that Fourier expansions of the individual currents, $i_1$ and $i_2$, reveal that certain components of each current are oppositely phased. Because of their opposite polarity, these components cancel as far as the external current, $i$, is concerned and simply circulate within the loop formed by the two diodes. From FIG. 1b, one can mathematically describe this circulating current as $$i_c = (i_2 - i_1)/2 = i_s[\cosh \alpha V - 1] \quad (10)$$

Substituting $$V = V_{LO} \cos \omega_{LO} t + V_s \cos \omega_s t \quad (11)$$

into the expansion for the hyperbolic cosine yields $$i_c = i_s[1 + \frac{(V_{LO}\cos W_{LO}t + V_s \cos W_s t)^2}{2!} + \ldots \quad (12)$$
$$- 1] = \frac{i_s}{2}[V_{LO}^2 \cos^2 W_{LO}t + V_s^2 \cos^2 W_s t + 2 V_{LO}V_s \cos W_{LO}t \cos W_s t + \ldots]$$

$$= \frac{i_s}{2}\left\{\frac{V_{LO}^2 + V_s^2}{2} + \frac{V_{LO}^2}{2} \cos 2 W_{LO}t \quad (13)\right.$$
$$+ \frac{V_s^2}{2} \cos 2W_s t + V_{LO}V_s [\cos (W_{LO} - W_s) t +$$
$$\left.\cos (W_{LO} + W_s) t] + \ldots\right\}$$

from which it can be seen that the circulating current only contains frequencies $$mf_o \pm nf_s \text{ where } m + n = \text{even integer} \quad (14)$$

Thus, the anti-parallel pair has the advantage of suppressing fundamental and other odd harmonic mixing products as well as even harmonics of the local oscillator.

This natural suppression is lessened, of course, by diode unbalance. If we first consider the case where the saturation currents, $i_s$, are different for the two diodes, then we may let $$i_{s1} = i_s + \Delta i_s \text{ and } i_{s2} = i_s - \Delta i_s \quad (15)$$

Substitution of the above expressions into Equations (3), (4) and (5) yields the following equation for the total conductance, g:

$$g = 2 \alpha i_s[\cosh \alpha V + \Delta i_s/i_s \sinh \alpha V] \quad (16)$$

Similarly, if the diode slope parameters are different, we may let $$\alpha_1 = \alpha + \Delta \alpha \text{ and } \alpha_2 = \alpha - \Delta \alpha \quad (17)$$

which yields the following expression for the total conductance.

$$g = 2 \alpha i_s e^{(\Delta \alpha)V}[\cosh \alpha V + \Delta \alpha/\alpha \sinh \alpha V] \quad (18)$$

Notice that in both cases, the conductance function contains the desired hyperbolic cosine term plus a hyperbolic sine term whose coefficient is proportional to either $$\Delta i_s/i_s$$

or $$\Delta \alpha/\alpha.$$

This hyperbolic sine term introduces conductance variations at the fundamental and other odd harmonics of the total oscillator. We may find the ratio of the conductance component at the fundamental, $g^{(1)}$, to the conductance component at the second harmonic, $g^{(2)}$, by simply substituting $V = V_s \cos \omega_s t$ into Equations (16) and (18) and expanding Equations (16) and (18) with the following result:

$$\frac{g^{(1)}}{g^{(2)}} = \frac{\Delta i_s}{i_s} \cdot \frac{I_1(\alpha V_o)}{I_2(\alpha V_o)} \text{ for } i_s \text{ unbalance} \quad (19)$$

and $$\frac{g^{(1)}}{g^{(2)}} = \frac{\Delta \alpha}{\alpha} \frac{I_1(\alpha V_o)}{I_2(\alpha V_o)} \text{ for } \alpha \text{ unbalance.} \quad (20)$$

Figure 2:
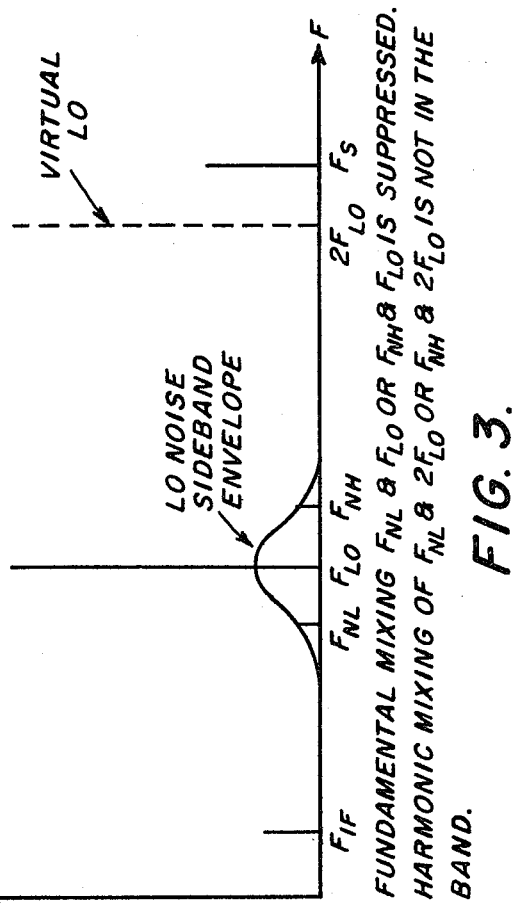
FIG. 2 is a plot of unbalance versus local oscillator power utilizing the anti-parallel diode pair of the invention.

In FIG. 2 the ratio $$g^{(1)}/g^{(2)}$$

is plotted versus $$\Delta \alpha/\alpha$$

or $$\Delta i_s/i_s$$

It can be seen that if one were to operate under local oscillator "starved" conditions ($V_{LO} < .1$ volt) the effect of the unbalance can be severe. However, for typical local oscillator voltages of 0.7 volt or greater Equations (19) and (20) reduce approximately to $$\frac{g^{(1)}}{g^{(2)}} = \frac{\Delta i_s}{i_s} \text{ for } i_s \text{ unbalance} \quad (21)$$

and $$\frac{g^{(1)}}{g^{(2)}} = \frac{\Delta \alpha}{\alpha} \text{ for } \alpha \text{ unbalance.} \quad (22)$$

Thus, the percentage unbalance in either $i_s$ or $\alpha$ translates directly into the percentage of $g^{(1)}$ as compared to $g^{(2)}$. This does not mean, however, that the ratio of undesired fundamental conversion loss to the desired second harmonic conversion loss will be directly proportional to $$g^{(1)}/g^{(2)},$$

since the conversion loss will depend on exactly what load impedance is presented to the diode at the fundamental mixing frequency. To accurately predict the fundamental conversion loss detailed characterization of the embedding circuit at the fundamental mixing frequency would be necessary.

The second harmonic mixing conversion loss may be estimated by noting (FIG. 1) that the PDR (Pulse Duty Ratio) for the anti-parallel diode pair will be essentially double that attainable at the fundamental local oscillator frequency since the period at the second harmonic is halved. It can be shown that a doubling of the PDR (for the matched image case) from a typical value of 15% to 30% represents a degradation of approximately 1.5 db for the second harmonic conversion loss as compared to fundamental mixing. Such an estimate, however, is only approximate.

Figure 3:
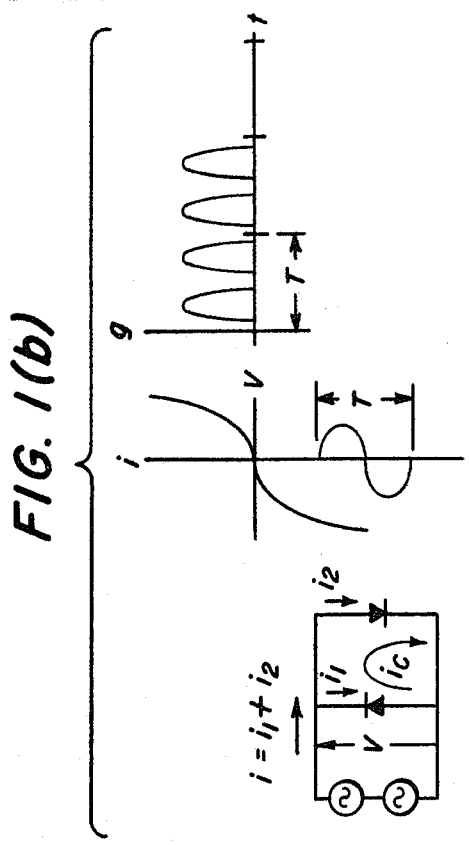
FIG. 3 is a plot showing noise sideband mixing products utilizing the anti-parallel diode pair of the invention.

The degradation of receiver noise figure due to local oscillation noise sidebands is also circumvented in even harmonic mixing ($m$ even, $n = 1$) in an anti-parallel diode pair as shown in FIG. 3. Local oscillator noise sidebands ($f_{NL}$ and $f_{NH}$) whose separation from the LO ($f_{LO}$) equals the IF ($f_{IF}$) generate IF noise which only circulates within the diode loop when they mix fundamentally with the local oscillator. Second harmonic mixing of these noise sidebands with the virtual LO ($2f_{LO}$) produces noise which is not within the IF amplifier pass band.

The circuit also has inherent self-protection against large peak inverse voltage burnout since a reverse biased junction is always in parallel with a forward biased junction. This limits the maximum reverse voltage excursion to a value much less than the reverse breakdown voltage of the diodes.

Figure 4A:
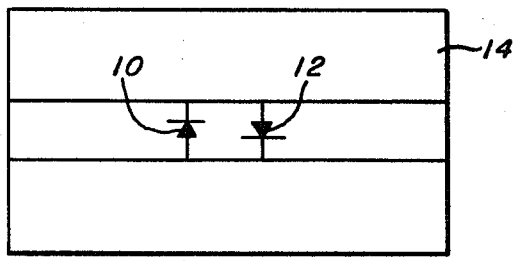
FIG. 4a is an illustration of one embodiment of the invention.
Figure 4B:
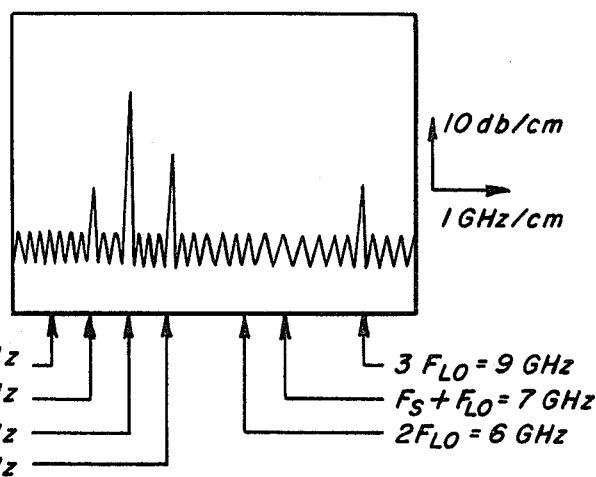

One embodiment of the invention is shown in FIG. 4a wherein a pair of anti-parallel diodes 10 and 12 is connected across a slot line 14 (a type of microwave integrated circuit transmission line). An input signal S and a local oscillator signal LO are fed into the left-end of the slot line 14; while the other end of the slot line is used to extract the harmonics and mixing products. If a 3 GHz local oscillator input and a 4 GHz low-level signal are impressed at the input to the slot line, the output spectrum will be as shown in FIG. 4b. Note that the output at $3f_{LO}$ is much greater than that at $2f_{LO}$. Note also the absence of fundamental mixing products, $f_s - f_{LO}$ and $f_s + f_{LO}$, and the relatively large 2 GHz intermediate frequency output due to second harmonic mixing ($2f_{LO} - f_s$).

Figure 5:
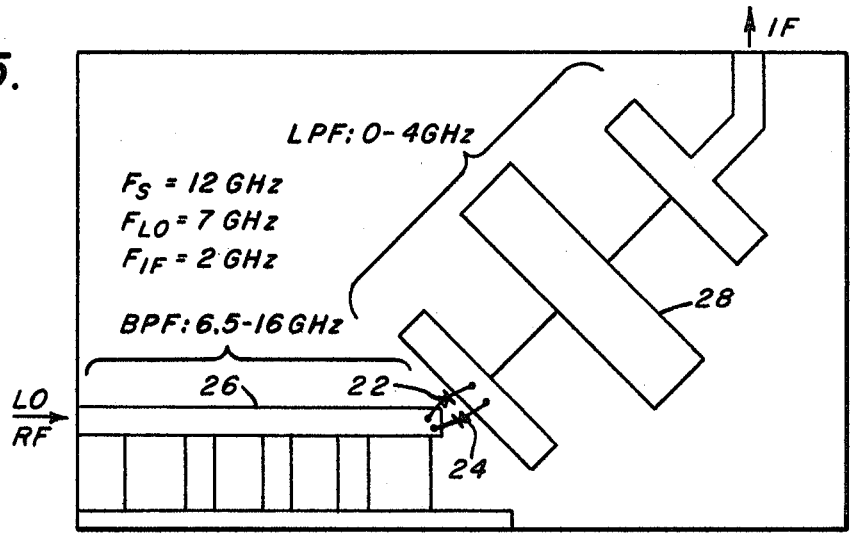
FIG. 5 is an illustration of an X-band MIC harmonic mixer utilizing the principles of the invention.
Figure 6:
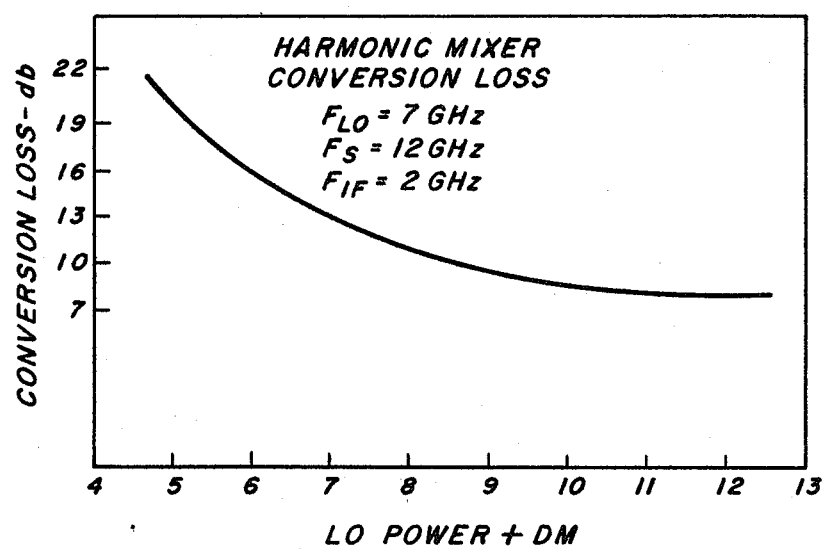
FIG. 6 is a plot of conversion loss versus local oscillator power for the MIC mixer of FIG. 5.

Another embodiment of the invention is shown in FIG. 5 wherein an existing microstrip mixer was modified to accommodate a series-mounted anti-parallel diode pair so as to evaluate second harmonic mixing at 12 GHz using a 7 GHz local oscillator signal. In FIG. 5, a pair of anti-parallel diodes 22 and 24 interconnect one end of a microstrip band-pass filter 26 to one end of a microstrip low-pass filter 28. A measured curve of the total circuit conversion loss (including the insertion loss of the band-pass and low-pass filters and microstrip to coaxial transitions at about 2 db) as a function of fundamental local oscillator drive is shown in FIG. 6. Although no attempt is made to optimize the signal and intermediate frequency impedance matches, the 8 db total conversion loss is comparable to that obtained by fundamental mixing at 12 GHz.

Other embodiments of the invention will be apparent to those skilled in the art. Although the invention has been shown in connection with certain specific embodiments, it will be readily apparent to those skilled in the art that various changes in form and arrangement of parts may be made to suit requirements without departing from the spirit and scope of the invention.

What is claimed is:

1. In a harmonic mixer for mixing two signals $V_{LO} \sin \omega_{LO} t$ and $V_s \sin \omega_s t$, a microwave transmission line, a pair of anti-parallel diodes connected in shunt across elements of said transmission line, means for applying both of said signals to said line and means for deriving an output signal from said line, characterized in that said output signal has angular frequency components $m \omega_{LO} \pm n \omega_s$, where $m + n$ is an odd integer.

2. The harmonic mixer of claim 1 wherein said line is a slot line.

3. The harmonic mixer of claim 2 wherein the signals $V_{LO} \sin \omega_{LO} t$ and $V_s \sin \omega_s t$ are fed into one end of said slot line.

4. The harmonic mixer of claim 1 wherein said output signal appears across said anti-parallel diodes.

5. The harmonic mixer of claim 1 wherein said line is a microstrip transmission system.

6. In a harmonic mixer for mixing two signals $V_{LO} \sin \omega_{LO} t$ and $V_s \sin \omega_s t$, a microwave transmission line, a pair of anti-parallel diodes connected in shunt across elements of said transmission line, means for applying both of said signals to said line and means for deriving an output signal from said line, characterized in that said output signal has angular frequency components $m \omega_{LO} \pm n \omega_s$, where $m$ equals 2 and $n$ is an odd integer.

7. The harmonic mixer of claim 6 wherein said integer $n$ is 1.

* * * * *